US007969732B1

(12) United States Patent  (10) Patent No.: US 7,969,732 B1
Noble  (45) Date of Patent: Jun. 28, 2011

(54) SUPPORT DEVICE FOR SUPPORTING A TABLET COMPUTER DEVICE

(76) Inventor: Kevin Noble, The Woodlands, TX (US)

( * ) Notice: Subject to any disclaimer, the term of this patent is extended or adjusted under 35 U.S.C. 154(b) by 0 days.

(21) Appl. No.: 12/839,149

(22) Filed: Jul. 19, 2010

(51) Int. Cl.
*H05K 5/00* (2006.01)
*H05K 7/00* (2006.01)

(52) U.S. Cl. ......... 361/679.56; 361/679.41; 361/679.44; 361/679.55; 248/917; 248/918

(58) Field of Classification Search ............. 361/679.41, 361/679.44, 679.55, 679.56; 248/917, 918, 248/676
See application file for complete search history.

(56) References Cited

U.S. PATENT DOCUMENTS

| 5,345,362 | A * | 9/1994 | Winkler | 361/679.06 |
| 7,796,379 | B2 * | 9/2010 | Tsai | 361/679.32 |
| 2008/0062625 | A1 * | 3/2008 | Batio | 361/680 |

OTHER PUBLICATIONS www.twelvesouth.com/products/: Author: Unknown; Title: BookArc for iPad; Date: Jun. 24, 2010.

* cited by examiner

*Primary Examiner* — Jayprakash N Gandhi
*Assistant Examiner* — Anthony M Haughton
(74) *Attorney, Agent, or Firm* — Eric Karich

(57) ABSTRACT

A support device has a base body having top and bottom surfaces. The bottom surface supports the base body upon a work-surface, and the top surface is disposed on a top surface plane that is rotated about 20 degrees from the plane of the work-surface. The top surface further includes a support slot construction that is adapted to support a tablet computer device in two work positions. The support slot construction includes a rear sidewall and a first front sidewall spaced apart from each other by a first bottom surface, which together hold the tablet computer device on a first plane that is rotated about 75 degrees from the work surface plane. A second front sidewall spaced apart from the first front sidewall by a second bottom surface together supporting the tablet computer device on a second plane that is rotated about 65 degrees from the plane of the work-surface.

6 Claims, 4 Drawing Sheets

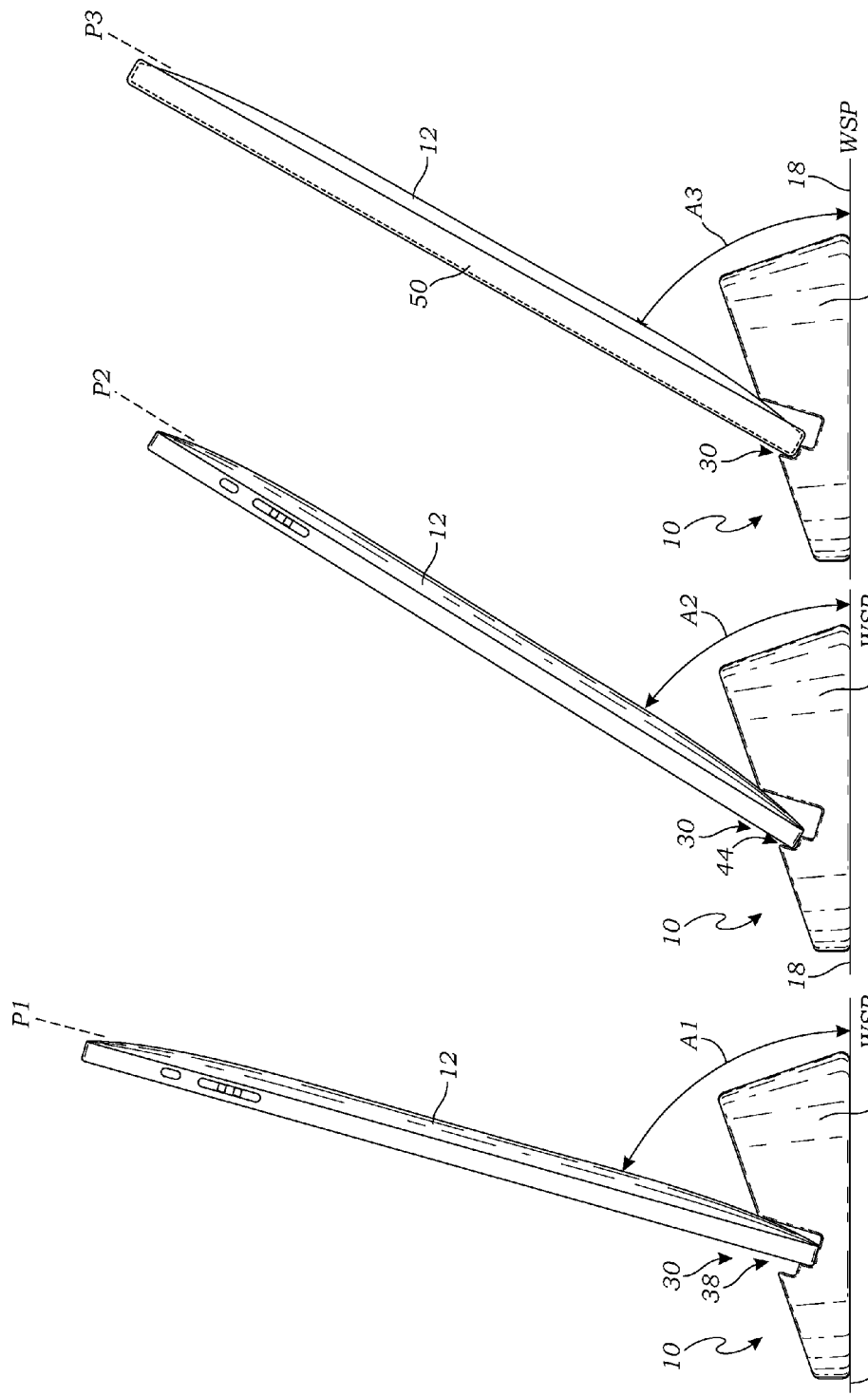

SUPPORT DEVICE FOR SUPPORTING A TABLET COMPUTER DEVICE

CROSS-REFERENCE TO RELATED APPLICATIONS

Not Applicable

BACKGROUND OF THE INVENTION

1. Field of the Invention

This invention relates generally to support devices, and more particularly to a support device adapted to support a portable electronic device, such as a tablet computer device.

2. Description of Related Art

There are various bases and charging units in the prior art for supporting various types of portable electronic devices (e.g., tablet PCs, MP3 Players, e-readers such as KINDLE®, and various APPLE® products, including iPAD® and iTOUCH® devices, etc.). Most of these devices mount the device in an upright orientation, and are primarily adapted for storage and/or charging the device while it is not in use.

A product sold under the trademark BOOKARC™ by TwelveSouth includes a slot having a silicone insert that supports a iPAD® in a vertical position. The slot includes a notch that enables the iPAD® to be tilted to a second, slightly reclined position for watching videos. The silicone insert may be removed to receive the iPAD® when it is wrapped in a protective case. The BOOKARC™ product does not enable much flexibility, however, and only holds the iPAD® in a single working (angled) position (plus the stored, vertical position). The BOOKARC® also cannot accept the iPAD® with the case, unless the silicone insert is first removed. Once removed, the silicone insert is easily lost, in which case the product cannot work on an iPAD® without the case.

The prior art teaches various base supports and/or charging stations for various forms of personal electronic devices. However, the prior art does not teach a support device for supporting a tablet computer device in multiple reclined positions, thereby enabling the user to select a degree of incline that is best suited for his or her use. The present invention fulfills these needs and provides further related advantages as described in the following summary.

SUMMARY OF THE INVENTION

The present invention teaches certain benefits in construction and use which give rise to the objectives described below.

The present invention provides a support device for operatively supporting a tablet computer device upon a work-surface. The support device comprises a base body having a top surface and a bottom surface connected by a side surface. The bottom surface is shaped to support the base body upon the work-surface. The top surface includes a support slot construction that is adapted to support the tablet computer device in either a first work position or a second work position. The support slot construction includes a rear sidewall and a first front sidewall spaced apart from each other by a first bottom surface, the rear sidewall, the first front sidewall, and the first bottom surface together defining a first slot shaped to receive the perimeter edge of the tablet computer device. The first slot operates to hold the tablet computer device on a first plane that is rotated about 75 degrees from a plane of the work-surface. The support slot construction further includes a second front sidewall spaced apart from the first front sidewall by a second bottom surface, the rear sidewall, the second front sidewall, and the second bottom surface together defining a second slot shaped to receive the perimeter edge of the tablet computer device. The second slot operates to hold the tablet computer device on a second plane that is rotated about 65 degrees from the plane of the work-surface.

A primary objective of the present invention is to provide a support device having advantages not taught by the prior art.

Another objective is to provide a support device that includes a support slot construction having first and second slots for supporting a tablet computer device in multiple reclined positions, thereby enabling the user to select a degree of incline that is best suited for his or her use.

Another objective is to provide a support device that includes an inclined top surface for providing additional viewing angles.

A further objective is to provide a support device that may be used in conjunction with a standard tablet computer device, or in conjunction with a tablet computer device that is covered by a protective case.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings:

FIG. 4 is a side elevational view of the tablet computer device mounted on the support device in a first work position;

FIG. 5 is a side elevational view of the tablet computer device mounted on the support device in a second work position;

FIG. 6 is a side elevational view of the tablet computer device in a protective case mounted on the support device.

DETAILED DESCRIPTION OF THE INVENTION

The above-described drawing figures illustrate the invention, a support device 10 for operatively supporting a tablet computer device 12 upon a work-surface 18. The support device 10 functions to support the tablet computer device 12 in multiple operative positions, at predetermined angles, for optimum use.

Figure 1:
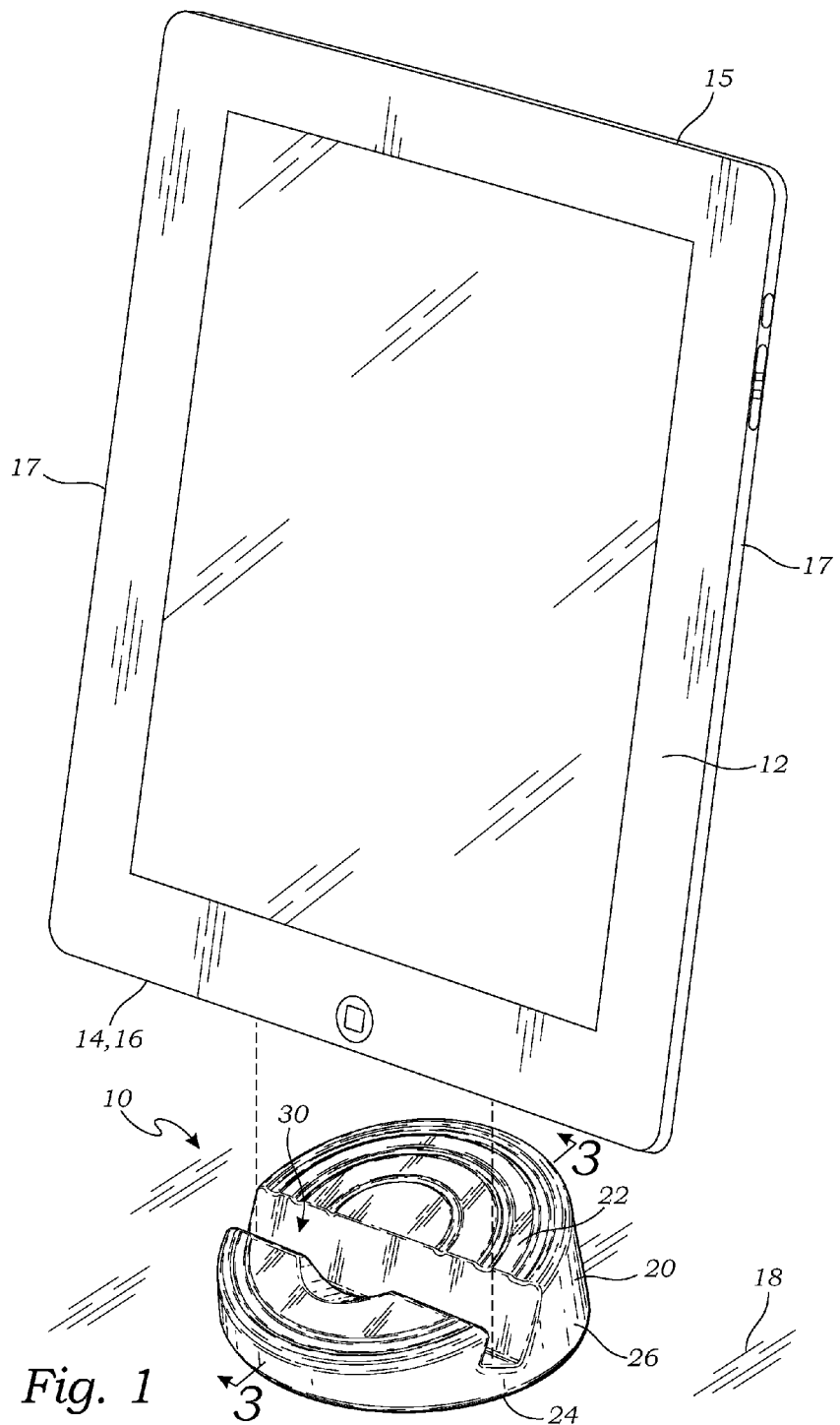
FIG. 1 is an exploded perspective view of a support device according to one embodiment of the present invention, illustrating how a tablet computer device is mounted on the support device.
Figure 2:
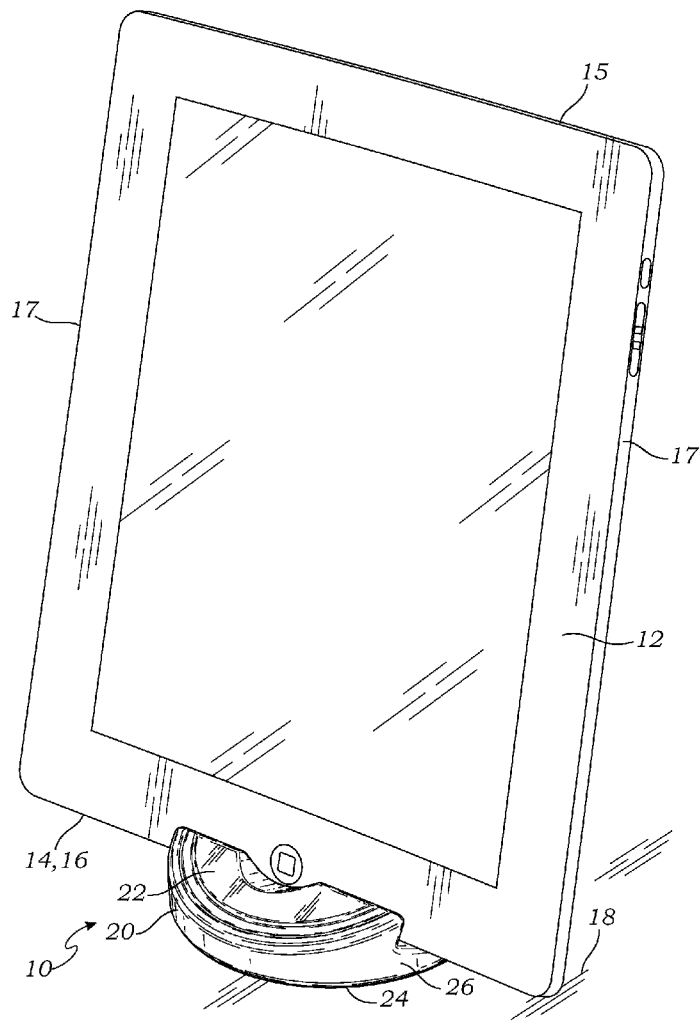
FIG. 2 is a perspective view of the support device once the tablet computer device has been mounted thereupon.
Figure 3:
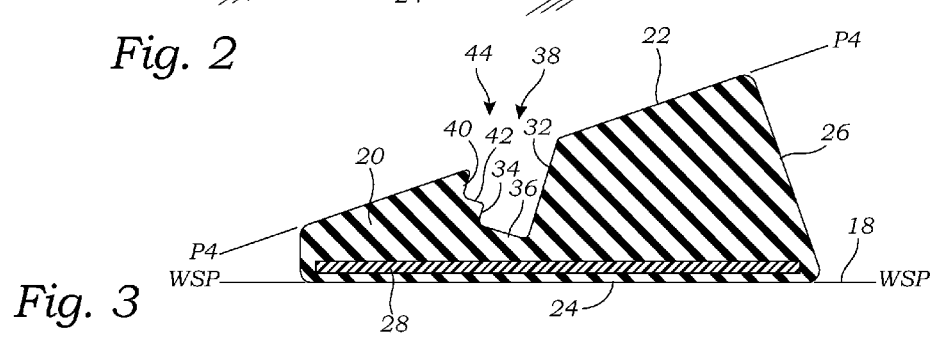
FIG. 3 is a sectional view of the support device taken along line 3-3 in FIG. 1.

FIG. 1 is an exploded perspective view of the support device 10 according to one embodiment of the present invention, illustrating how the tablet computer device 12 may be mounted on the support device 10. FIG. 2 is a perspective view thereof. FIG. 3 is a sectional view of the support device 10 taken along line 3-3 in FIG. 1.

As shown in FIGS. 1-3, the support device 10 includes a base body 20 having a top surface 22 and a bottom surface 24 connected by a side surface 26. The bottom surface 24 is shaped to support the base body 20 upon the work-surface 18. As illustrated, the bottom surface 24 may be a planar non-skid surface; however, alternative shapes are also possible, as long as they function to properly support the support device 10 once the tablet computer device 12 has been mounted thereupon.

In one embodiment, the support device 10 has an annular side surface 26, so that the support device 10 is generally disk-shaped. In this embodiment, the support device 10 may be a molded part, and may be molded of a heavy and non-skid material, most preferably an elastomer such as rubber, polyurethane, or similar material. In another embodiment, the support device 10 may be constructed of another material (e.g., metal, plastic, etc.) and provided with a soft plastic, rubber, or silicone covering (not shown) for the top and/or the bottom surfaces.

In the embodiment of FIG. 3, the support device 10 may further include a weighted plate 28 attached to or integrally molded into the support device 10, adjacent the bottom surface 24. The weighted plate 28, which may be constructed of a weighted material (e.g., metal, or similarly heavy material), is positioned adjacent the bottom surface 24 to provide additional stability to the support device 10. In the embodiment of FIG. 3, the weighted plate 28 is disc shaped, and is integrally molded into the support device 10, so that it is not visible from the exterior of the support device 10, and so that the metal cannot scratch the tablet computer device 12 or the work-surface 18, but so that the weighted plate 28 provides great stability to the support device 10 while supporting the tablet computer device 12, especially during use.

The tablet computer device 12 includes a perimeter edge 14 that may include a top edge 15, a bottom edge 16, and side edges 17. The tablet computer device 12 may be, for example, an iPAD® tablet computer, sold by APPLE® computers; however, it may also include other forms of tablet computers, e-readers (e.g., KINDLE®), and also other computer devices with display screens, such as cellular telephones, portable gaming systems, and other similar devices. The tablet computer device 12 is typically mounted on its bottom edge 16, or one of the side edges 17, depending upon the desired orientation of the screen.

A support slot construction 30 extends into the top surface 22 and is adapted to support the tablet computer device 12 in either a first work position or a second work position. In the embodiment of FIGS. 1-3, the support slot construction 30 includes a rear sidewall 32 and a first front sidewall 34 spaced apart from each other by a first bottom surface 36. The rear sidewall 32, the first front sidewall 34, and the first bottom surface 36 together defining a first slot 38 shaped to receive the perimeter edge 14 of the tablet computer device 12 to hold the tablet computer device 12 on a first plane P1 that is rotated from a plane WSP of the work-surface 18.

FIG. 4 is a side elevational view of the tablet computer device 12 mounted on the support device 10 in a first work position, wherein the tablet computer device 12 is disposed on the first plane P1. As illustrated in FIGS. 1-4, in one embodiment, the first plane P1 is rotated a first angle A1, which may be 50-85 degrees, from the plane WSP of the work-surface 18. In another embodiment, the first plane P1 is rotated 65-80 degrees from the plane WSP of the work-surface 18, and it is preferably rotated about 75 degrees. For purposes of this application, the term "about" means +/−10 degrees.

FIG. 5 is a side elevational view of the tablet computer device 12 mounted on the support device 10 in a second work position, wherein the tablet computer device 12 is disposed on the second plane P2. As shown in FIGS. 1-3 and 5, the support slot construction 30 further includes a second front sidewall 40 spaced apart from the first front sidewall 34 by a second bottom surface 42. The rear sidewall 32, the second front sidewall 40, and the second bottom surface 42 together define a second slot 44 shaped to receive the perimeter edge 14 of the tablet computer device 12 to hold the tablet computer device 12 on a second plane P2.

The second plane P2 is rotated a second angle A2. The second angle A2 is smaller than the first angle A1, typically at least 10 degrees less than the first angle A1. In one embodiment, the second plane P2 is rotated 40-70 degrees from the work-surface 18 plane WSP; in another embodiment, the second plane P2 is rotated 60-70 degrees from the work-surface 18 plane, and it is preferably rotated about 65 degrees.

FIG. 6 is a side elevational view of the tablet computer device 12 in a protective case 50 mounted on the support device 10. As illustrated in FIG. 6, the tablet computer device 12 may be mounted in the support slot construction 30 despite the added bulk of the protective case 50, without any modification to the support device 10. The tablet computer device 12 is positioned on a third plane P3 that is rotated a third angle A3 that is somewhere between the first and second plane P1 and P2, depending upon the thickness of the protective case 50.

Figure 7:
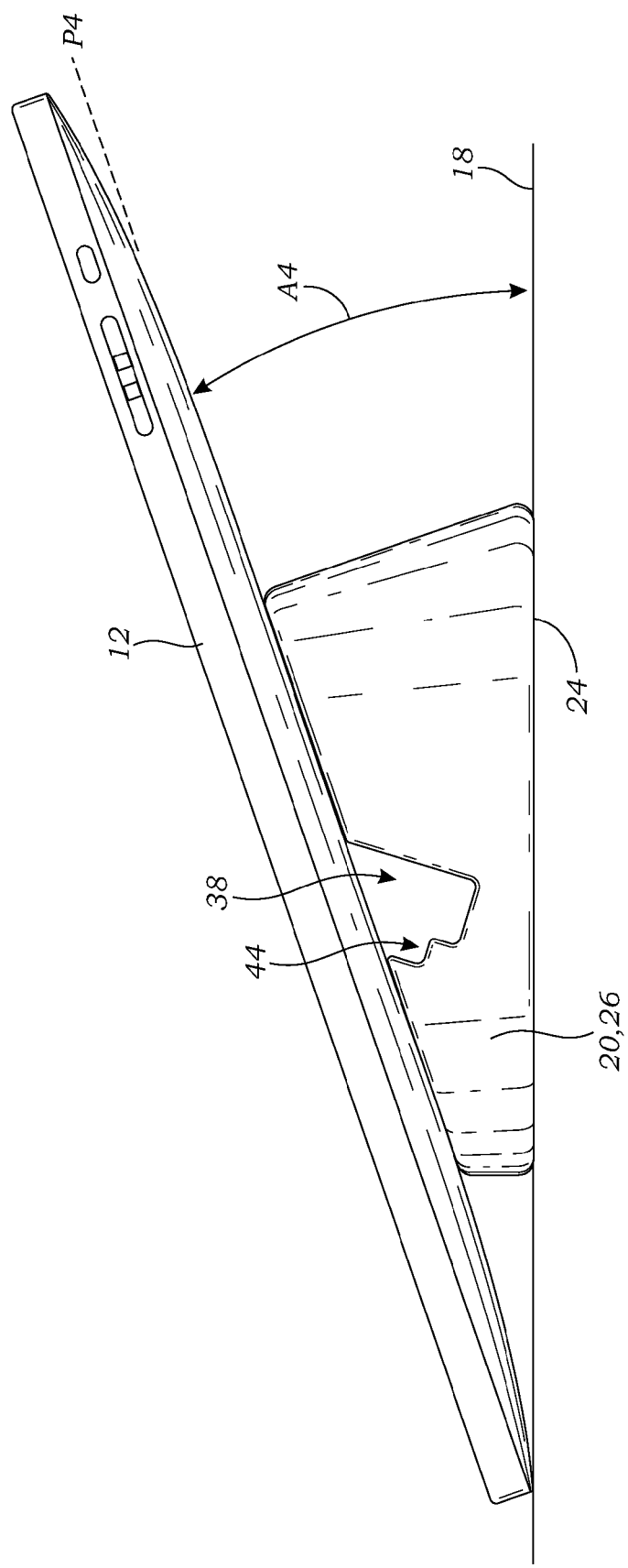
FIG. 7 is a side elevational view of the tablet computer device mounted on the support device in a third work position.

FIG. 7 is a side elevational view of the tablet computer device 12 mounted on the support device 10 in a third work position. As illustrated in FIG. 7, the top surface 22 is disposed on a top surface plane P4 that is rotated a fourth angle A4 that is at least 10 degrees from the work-surface 18 plane WSP. In one embodiment, the fourth angle A4 is 10-40 degrees. In another embodiment, the fourth angle A4 is 15-30 degrees, and it is preferably rotated about 20 degrees. In this embodiment, the tablet computer device 12 is rested on the top surface 22, as illustrated in FIG. 7, and thereby supported at this angle for use.

In this manner, the support device 10 is able to support the tablet computer device 12 in multiple orientations, to best suit the needs of the user. The support device 10 maintains great stability, regardless of the angle selected by the user, and enables multiple uses of the table computer device (e.g., typing and active browsing, which may require certain angles, verses viewing videos, and similar passive activities, which may require entirely different angles).

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

What is claimed is:

1. A support device for operatively supporting a tablet computer device upon a work-surface, the tablet computer device having a perimeter edge, the support device comprising:

a base body having a top surface and a bottom surface connected by a side surface, the bottom surface being shaped to support the base body upon the work-surface; and a support slot construction extending into the top surface and the side surface so that the support slot construction extends laterally across the base body and is adapted to support the tablet computer device in either a first work position or a second work position, the support slot construction having a rear sidewall and a first front sidewall spaced apart from each other by a first bottom surface, the rear sidewall, the first front sidewall, and the first bottom surface together defining a first slot shaped to receive the perimeter edge of the tablet computer device so that the tablet computer device abuts the first front sidewall, the first bottom surface, and the rear sidewall, to hold the tablet computer device on a first plane, the first plane being about 75 degrees from a plane of the work-surface, and the support slot construction further having a second front sidewall spaced apart from the first front sidewall by a second bottom surface, the rear sidewall, the second front sidewall, and the second bottom surface together defining a second slot shaped to receive the perimeter edge of the tablet computer device so that the tablet computer device abuts the second front sidewall, the second bottom surface, and the rear sidewall to hold the tablet computer device on a second plane, the second plane being about 65 degrees from the plane of the work-surface.

2. The support device of claim 1, wherein the top surface is disposed on a top surface plane that is about 20 degrees from the plane of the work-surface.

3. The support device of claim 1, further comprising a weighted plate positioned adjacent the bottom surface of the support device and parallel to the plane of the work surface.

4. The support device of claim 1, wherein the support device is molded from an elastomer.

5. A support device for operatively supporting a tablet computer device upon a work-surface, the tablet computer device having a perimeter edge, the support device comprising:
   a base body having a top surface and a bottom surface connected by an annular side surface, the bottom surface being shaped to support the base body upon the work-surface, wherein the top surface is disposed on a top surface plane that is about 20 degrees from the plane of the work-surface; and
   a support slot construction extending into the top surface and the side surface so that the support slot construction extends laterally across the base body and is adapted to support the tablet computer device in either a first work position or a second work position,
   the support slot construction having a rear sidewall and a first front sidewall spaced apart from each other by a first bottom surface, the rear sidewall, the first front sidewall, and the first bottom surface together defining a first slot shaped to receive the perimeter edge of the tablet computer device to hold the tablet computer device on a first plane that is about 75 degrees from a plane of the work-surface, and
   the support slot construction further having a second front sidewall spaced apart from the first front sidewall by a second bottom surface, the rear sidewall, the second front sidewall, and the second bottom surface together defining a second slot shaped to receive the perimeter edge of the tablet computer device to hold the tablet computer device on a second plane that is about 65 degrees from the plane of the work-surface.

6. A combination support device and tablet computer device for placement on a work-surface, the combination comprising:
   a tablet computer device having a device body that includes a perimeter edge that includes a top edge, a bottom edge, and side edges;
   a base body having a top surface and a bottom surface connected by a side surface, the bottom surface being shaped to support the base body upon the work-surface; and
   a support slot construction extending into the top surface and the side surface so that the support slot construction extends laterally across the base body and is adapted to support the tablet computer device in either a first work position or a second work position,
   the support slot construction having a rear sidewall and a first front sidewall spaced apart from each other by a first bottom surface, the rear sidewall, the first front sidewall, and the first bottom surface together defining a first slot shaped to receive the perimeter edge of the tablet computer device to hold the tablet computer device on a first plane that is about 75 degrees from a plane of the work-surface, and
   the support slot construction further having a second front sidewall spaced apart from the first front sidewall by a second bottom surface, the rear sidewall, the second front sidewall, and the second bottom surface together defining a second slot shaped to receive the perimeter edge of the tablet computer device to hold the tablet computer device on a second plane that is about 65 degrees from the plane of the work-surface.

\* \* \* \* \*